(12) United States Patent
Anderson et al.

(10) Patent No.: US 8,404,430 B2
(45) Date of Patent: Mar. 26, 2013

(54) MULTI-CHIP RETICLE PHOTOMASKS

(75) Inventors: Brent Alan Anderson, Jericho, VT (US); Jed Hickory Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/195,307

(22) Filed: Aug. 1, 2011

(65) Prior Publication Data
US 2011/0287349 A1   Nov. 24, 2011

Related U.S. Application Data

(62) Division of application No. 12/483,414, filed on Jun. 12, 2009, now Pat. No. 8,021,803.

(51) Int. Cl.
*G03F 7/00* (2006.01)
*G06F 17/50* (2006.01)

(52) U.S. Cl. .......................... 430/312; 716/55

(58) Field of Classification Search .............. 430/5, 311, 430/312, 313, 322; 716/50–56
See application file for complete search history.

(56) References Cited

U.S. PATENT DOCUMENTS

| 5,439,764 | A | 8/1995 | Alter et al. |
|---|---|---|---|
| 6,969,571 | B2 | 11/2005 | Noudo et al. |
| 7,369,213 | B2 | 5/2008 | Noudo et al. |
| 7,396,617 | B2 | 7/2008 | Rockwell et al. |
| 2003/0203290 | A1 | 10/2003 | Misaka |
| 2005/0196680 | A1* | 9/2005 | Bouche et al. ................. 430/5 |
| 2006/0143589 | A1 | 6/2006 | Horng et al. |
| 2010/0316938 | A1 | 12/2010 | Anderson et al. |

OTHER PUBLICATIONS

Notice of Allowance (Mail Date May 13, 2011) for U.S. Appl. No. 12/483,414, filed Jun. 12, 2009; Confirmation No. 9205.

* cited by examiner

*Primary Examiner* — Stephen Rosasco
(74) *Attorney, Agent, or Firm* — Schmeiser, Olsen & Watts; Richard Kotulak

(57) ABSTRACT

A multi-chip reticle, methods of designing and fabricating multi-chip reticles, a system for designing a multi-chip reticle, and a method of fabricating integrated circuit chips using the multi-chip reticle. The multi-chip reticle includes a transparent substrate having two or more separate chip images arranged in an array, each chip image of said two or more chip images having only one type of reticle image, wherein at least two of said two more chip images have different types of reticle images.

27 Claims, 12 Drawing Sheets

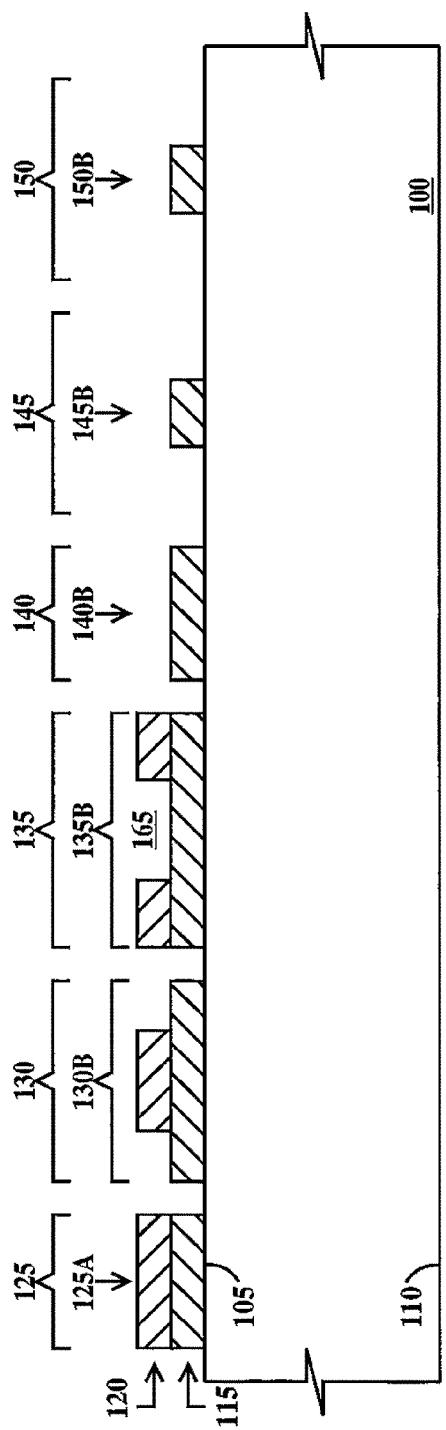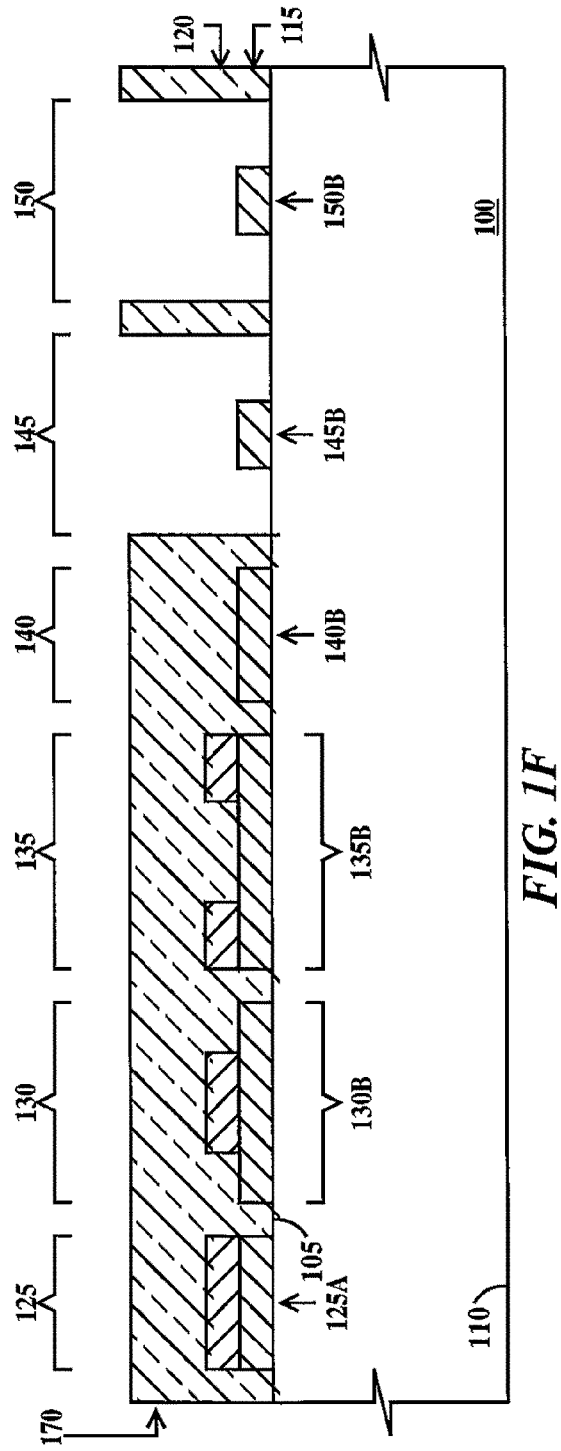

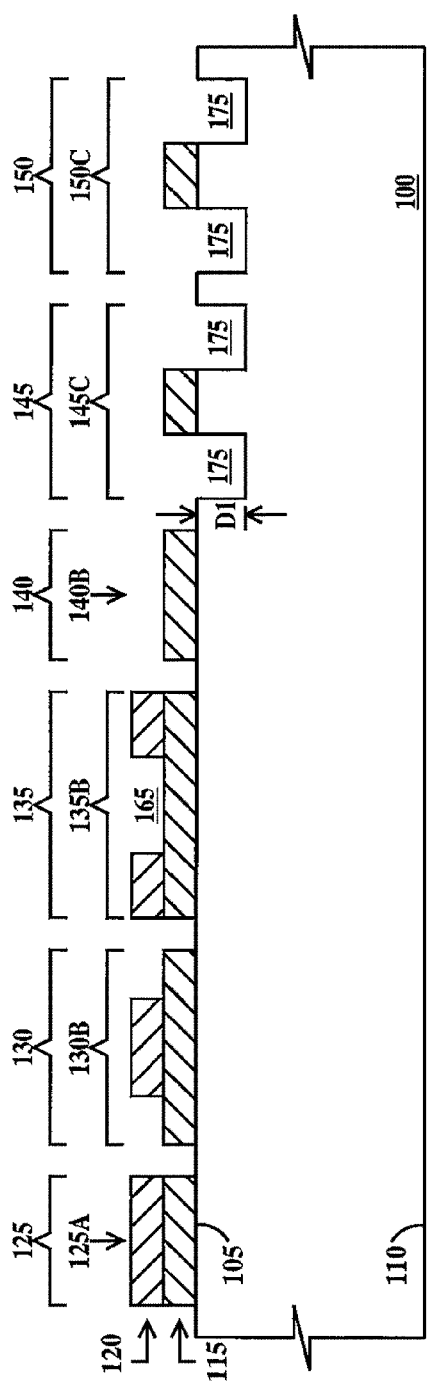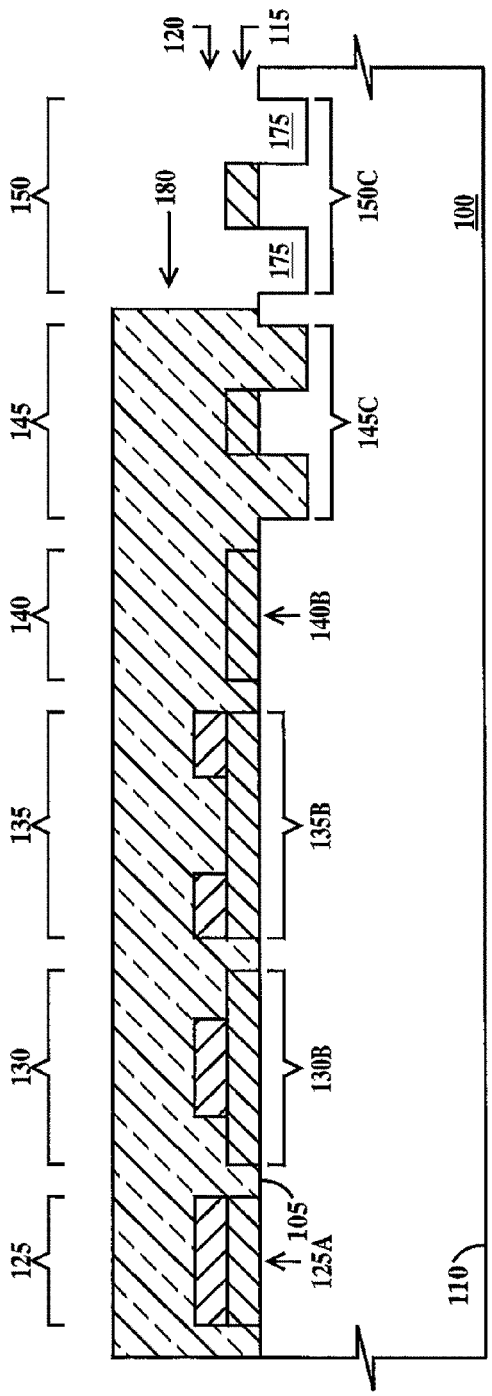

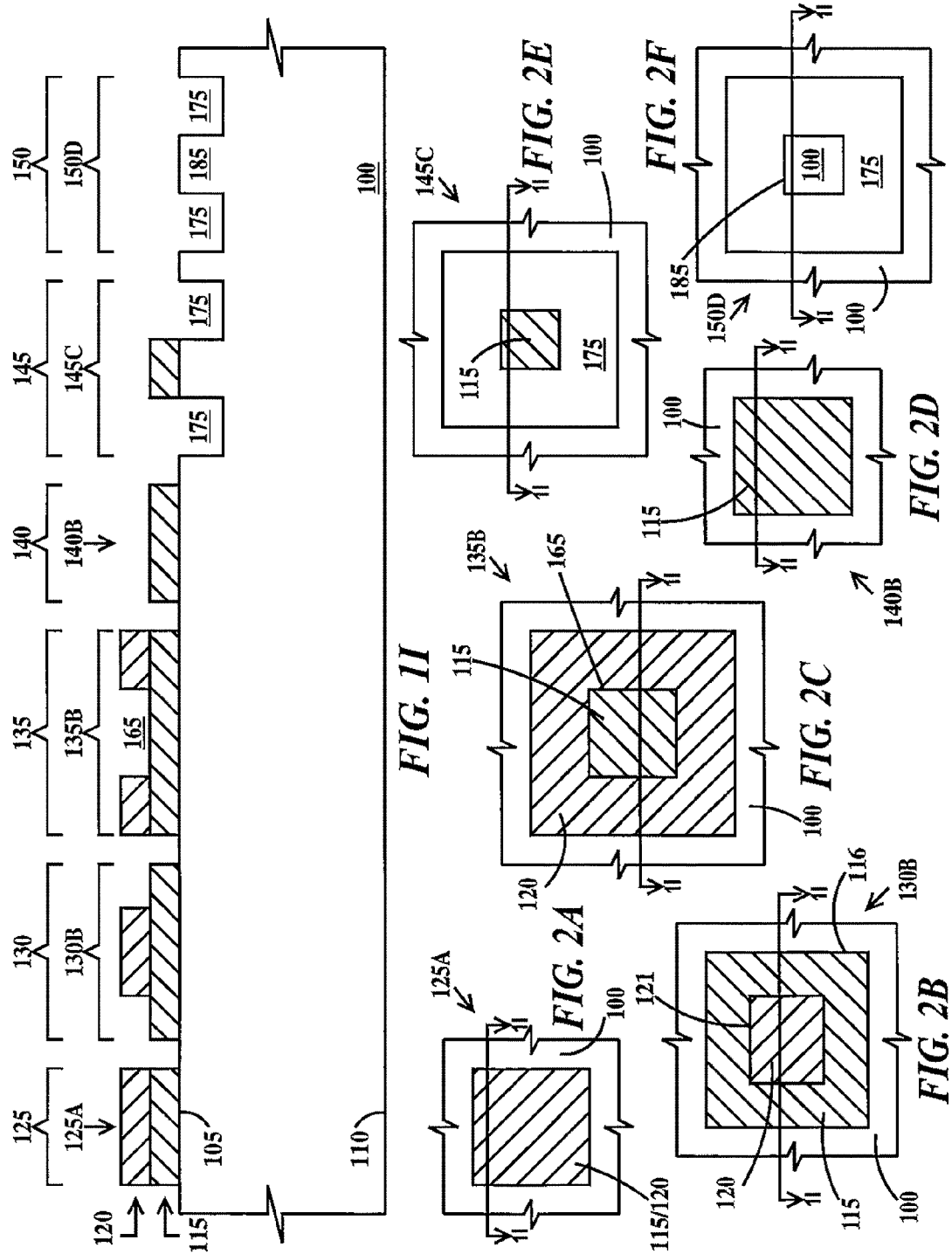

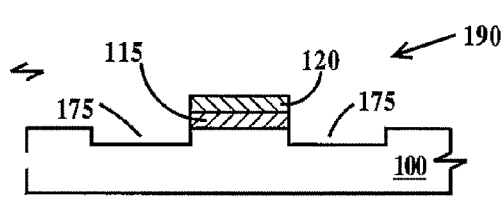
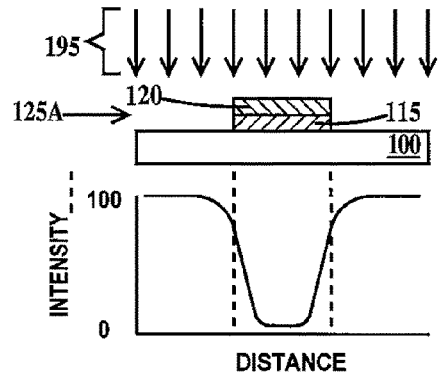
FIG. 2G
FIG. 3A
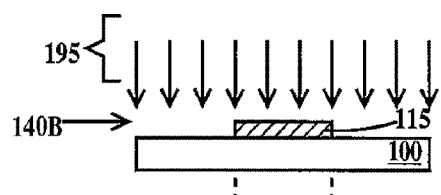
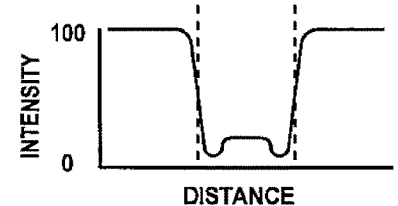
FIG. 3B
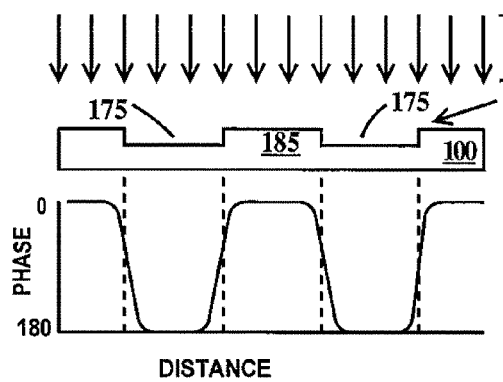
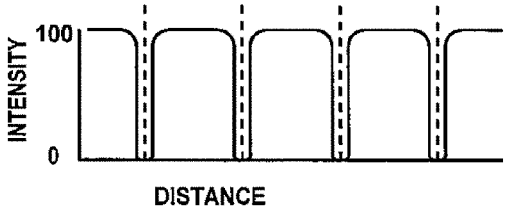
FIG. 3C

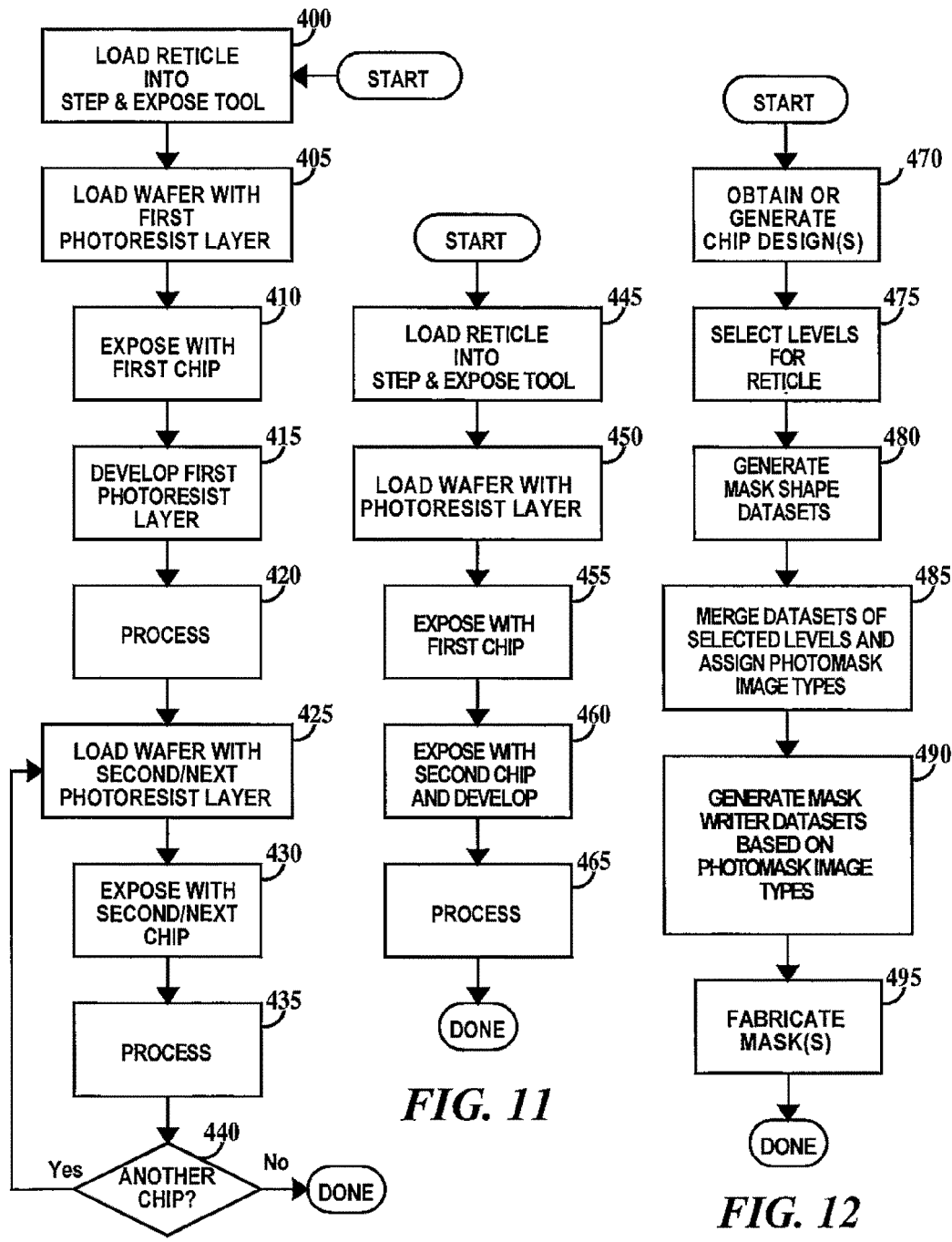

MULTI-CHIP RETICLE PHOTOMASKS

RELATED APPLICATIONS

This application is a division of U.S. patent application Ser. No. 12/483,414 filed Jun. 12, 2009, now U.S. Pat. No. 8,021,803, issued Sep. 20, 2011.

FIELD OF THE INVENTION

The present invention relates to the field of photolithography; more specifically, it relates to multi-chip reticles, methods of fabricating integrated circuit chips using multi-chip reticles, methods of fabricating multi-chip reticles, methods of designing multi-chip reticles and a system for designing multi-chip reticles.

BACKGROUND OF THE INVENTION

Integrated circuits are fabricated using photolithographic processes that use patterned reticles to define the structures formed in semiconductor substrates that comprise the integrated circuit. Fabrication of a single integrated circuit can require reticle sets containing significant numbers of expensive reticles so the industry has moved to multi-level reticles (MLR) to save mask costs. The expanding number of different types of structures for reticle enhancement technology has prevented significant cost savings from MLR being realized. Accordingly, there exists a need in the art to reduce the associated costs of reticles.

SUMMARY OF THE INVENTION

A first aspect of the present invention is a multi-chip reticle, comprising: a transparent substrate having two or more separate chip images arranged in an array, each chip image of the two or more chip images having only one type of reticle image, wherein at least two of the two more chip images have different types of reticle images.

A second aspect of the present invention is a method of forming a multi-chip reticle, comprising: providing a transparent substrate; and forming two or more separate chip images arranged in an array on the substrate, each chip image of the two or more chip images having only one type of reticle image, wherein at least two of the two or more chip images have different types of reticle images.

A third aspect of the present invention is a method of forming an integrated circuit chip, comprising: (a) loading a multi-chip reticle into a photolithographic exposure tool, the multi-chip reticle having two or more separate chip images arranged in an array, each chip image of the two or more chip images having only one type of reticle image, wherein at least two of the two or more chip images have different types of reticle images; after (a), then (b) coating a semiconductor substrate with a photoresist layer, loading the substrate into the photolithographic exposure tool, exposing the first photoresist layer using a first chip image of the two or more chip images; and after (b), either (c) removing the substrate from the photolithography tool, developing the first photoresist layer, processing the substrate, removing the first photoresist layer, coating the semiconductor substrate with a second photoresist layer, loading the substrate into the photolithographic exposure tool, exposing the second photoresist layer using a second chip image of the two or more chip images, the second chip image having only one and a different type of reticle image than the first chip image, removing the substrate, developing the second photoresist layer, further processing the substrate and removing the second photoresist layer or (d) exposing the first photoresist layer using a second chip image of the two or more chip images, the second chip image having only one and a different type of reticle image than the first chip image, removing the substrate, developing the first photoresist layer, processing the substrate and removing the first photoresist layer.

A fourth aspect of the present invention is a method, comprising: selecting fabrication levels from one or more integrated circuit designs; generating a mask shape dataset for each selected fabrication level; merging the mask shape datasets into a single multi-chip mask shape dataset representing two or more chip images, each chip image of the two or more chip images assigned only one type of reticle image, wherein at least two of the two or more chip images are assigned different types of reticle images; generating a set of mask writer datasets based on the multi-chip mask shape dataset and reticle image type of each chip image of the two or more chip images; and wherein the generating the mask shape dataset, merging the mask shape datasets and generating the set of mask writer datasets are performed by processors of one or more computers.

A fifth aspect of the present invention is a computer system including a computer comprising a processor, an address/data bus coupled to the processor, and a computer-readable memory unit coupled to communicate with the processor, the memory unit containing instructions that when executed by the processor implement a method for designing a multi-chip reticle, the method comprising the computer implemented steps of: selecting fabrication levels from one or more integrated circuit designs; generating a mask shape dataset for each selected fabrication level; merging the mask shape datasets into a single multi-chip mask shape dataset representing two or more chip images, each chip image of the two or more chip images assigned only one type of reticle image, wherein at least two of the two more chip images are assigned different types of reticle images; and generating a set of mask writer datasets based on the multi-chip mask shape dataset and the reticle image type of each chip image of two or more chip images.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1I are cross-section views through a reticle illustrating an exemplary fabrication of six reticle images types according to embodiments of the present invention;

FIGS. 2A through 2F are top views of the exemplary reticle image types illustrated in cross-section in FIG. 1I;

FIG. 2G is a cross-sectional view of a seventh reticle image type according to embodiments of the present invention;

FIG. 3A illustrates an aerial image generated from a binary reticle image;

FIG. 3B illustrates an aerial image generated from an attenuated phase shift reticle image;

FIG. 3C illustrates an aerial image generated from an alternating phase shift reticle image;

FIG. 10 is a flowchart illustrating a fabrication of integrated circuit using multi-chip reticles according to embodiments of the present invention;

FIG. 11 is a flowchart illustrating a fabrication of integrated circuit using multi-chip reticles in a dual-reticle chip fabrication process according to embodiments of the present invention;

FIG. 12 is a flowchart illustrating fabrication of a multi-chip reticle according to the embodiments of the present invention.

DETAILED DESCRIPTION OF THE INVENTION

A photolithographic process is one in which a photosensitive photoresist layer is applied to a surface of a substrate, the photoresist layer exposed to radiation through a photomask having a pattern of image structures and the exposed photoresist layer developed to form a patterned photoresist layer. After processing (e.g., an etch or an ion implantation), the patterned photoresist is removed. Processing results in a physical change of the substrate. Fabrication of an integrated circuit chip requires multiple photolithographic processes to define the chip structures of the various chip levels that make up an integrated circuit chip. A reticle is a type of photomask.

There are three primary types of optical reticles, binary, attenuated phase shift, and alternating phase shift of particular interest. The present invention recognizes these and variations of these three basic types of reticles. Reticles according to embodiments of the present invention are multi-chip reticles, that is, reticles having more than one chip image defining one or more chip fabrication levels. Chip images consist of reticle images. The terms chip image and reticle image, unless otherwise noted, are and describe physical structures. The different chip images may define (i) different levels of a same integrated circuit chip design, (ii) the same fabrication level of different integrated circuit chip designs (by exposing chips of different designs separately), (iii) in combination define a same fabrication level of a same integrated circuit chip design, or combinations thereof. At least two of the chip images consist of different reticle image types, however each chip image includes only one type of reticle image. Different reticle image types are defined to have different physical structures.

FIGS. 1A through 1I are cross-section views through a reticle illustrating an exemplary fabrication of six reticle images types according to embodiments of the present invention. FIGS. 1A through 1I illustrate fabrication of six different types of reticle images.

Figure 1A:
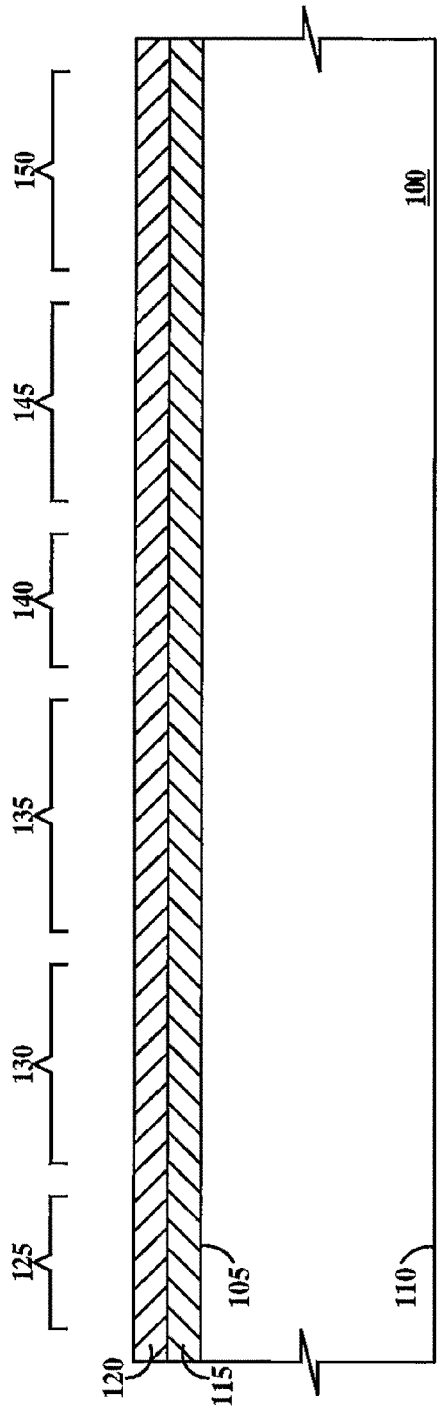

In FIG. 1A, a reticle substrate 100 has a top surface 105 and an opposite bottom surface 110. Formed on top surface 105 is partial transmittance layer 115. Formed on a top surface of partial transmittance layer 115 is an opaque layer 120. In one example, substrate 100 has a transmittance to the designed wavelength of light (e.g., 193 nm, 157 nm) between about 3% and about 20%. In one example, partial transmittance layer 115 has a transmittance to the designed wavelength of light of between about 3% and about 20%. In one example, opaque layer 120 has a transmittance to the designed wavelength of light is between about 0.5% and about 0%. In one example substrate 100 is about 0.25 inches thick. In one example, partial transmittance layer 115 is between about 400 Å and about 800 Å thick. In one example, opaque layer 120 is between about 700 Å and about 1300 Å thick. Substrate 100 may comprise quartz, sapphire, silicon dioxide, and calcium fluoride. Partial transmittance layer 115 may comprise molybdenum silicide (MoSi), aluminum, chrome, iron or carbon. Opaque layer 120 may comprise chrome (Cr), carbon or MoSi. Substrate 100 is divided into six regions 125, 130, 135, 140, 145 and 150 in which one of the six different types of reticle images will be fabricated.

Figure 1B:
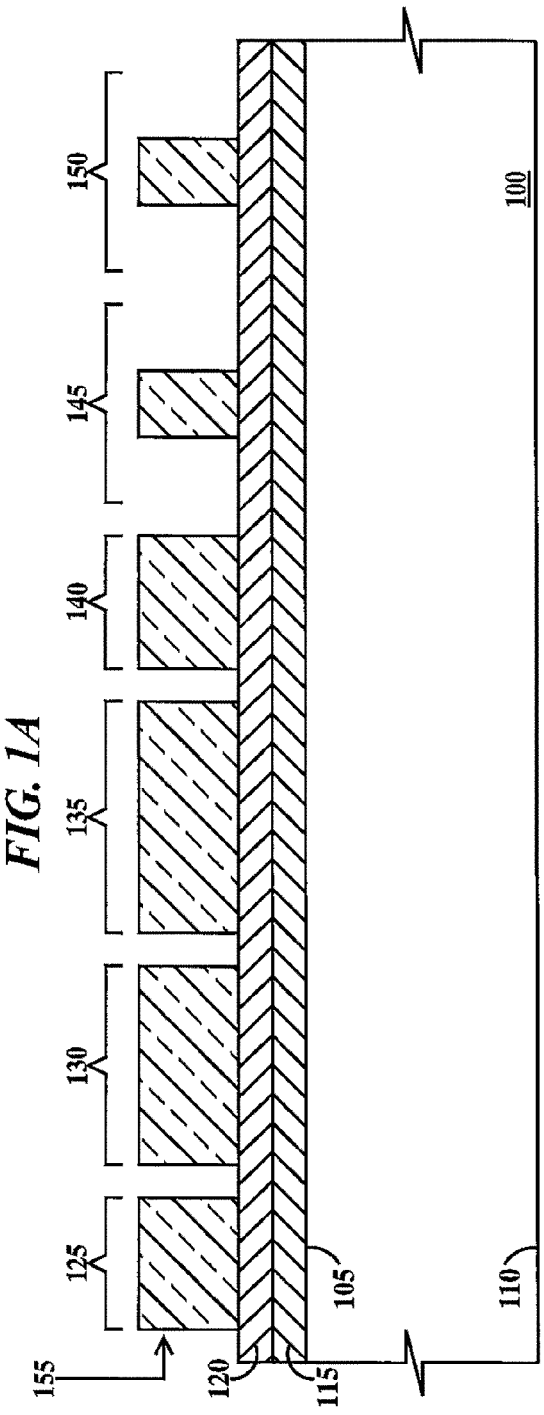

In FIG. 1B a patterned photoresist layer 155 is formed. Photoresist layer 155 covers all of regions 125, 130, 135 and 140 and only portions of regions 145 and 150. The pattern of patterned photoresist layer 155 is defined by a mask fabrication data set as described infra.

Figure 1C:
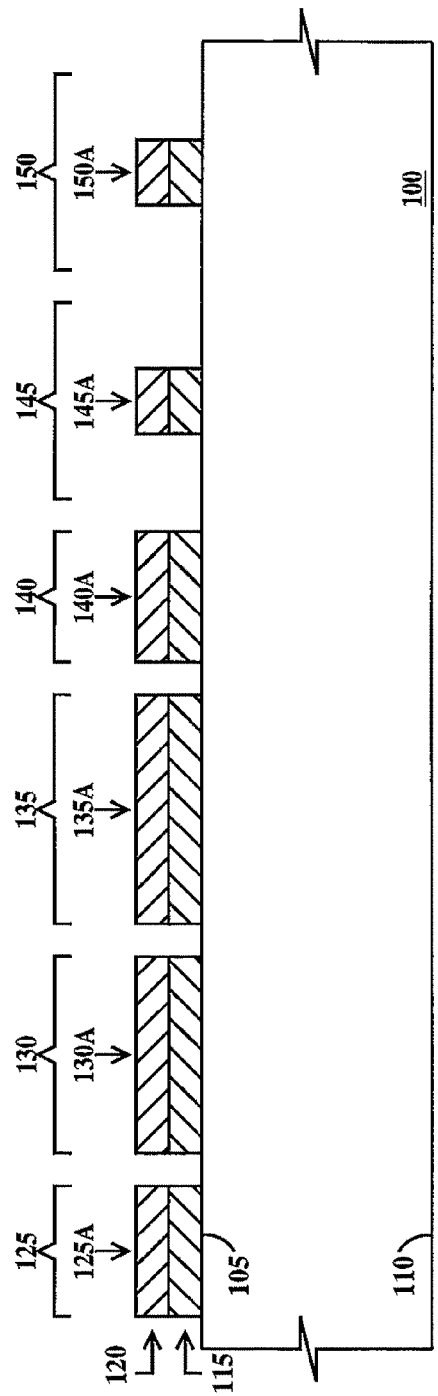

In FIG. 1C, opaque layer 120 and partial transmittance layer 115 have been removed (e.g., by reactive ion etching) where opaque layer 120 was not protected by photoresist layer 155 (see FIG. 1B) to form a completed binary reticle image 125A and intermediate structures 130A, 135A, 140A, 145A and 150A, each comprising co-extensive layers of partial transmittance layer 115 and opaque layer 120. Photoresist layer 155 (see FIG. 1B) is removed after etching partial transmittance layer 115. Substrate 100 is not or is not significantly etched by the etching of partial transmittance layer 115.

Figure 1D:
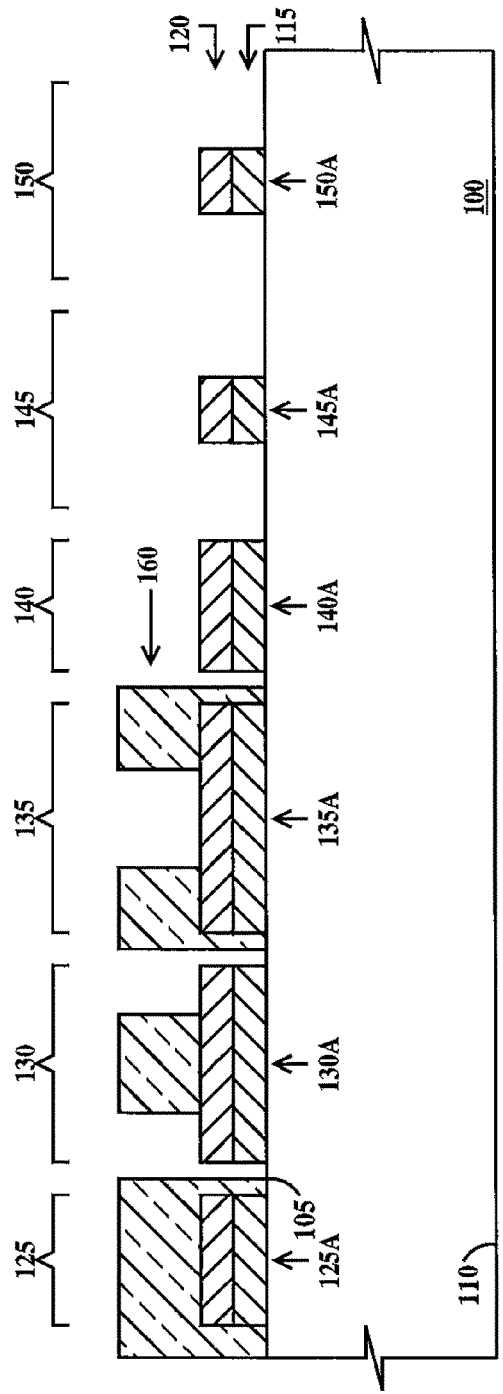

In FIG. 1D, a patterned photoresist layer 160 is formed. Photoresist layer 160 covers all of binary reticle image 125A and regions of intermediate structures 130A and 135A and none of intermediate structures 140A, 145A and 150A. The pattern of patterned photoresist layer 160 is defined by a mask fabrication data set as described infra.

In FIG. 1E, opaque layer 120 has been removed (e.g., by reactive ion etching) where opaque layer 120 was not protected by photoresist layer 160 (see FIG. 1D) to form a completed a positive phase shift reticle image 130B, a completed a negative phase shift reticle image 135B (having an opening 165 in opaque layer 120 in which partial transmittance layer 115 is exposed), a completed attenuated phase shift reticle image 140B and intermediate structures 145B and 150B. Photoresist layer 160 (see FIG. 1D) is removed after etching opaque layer 120. Partial transmittance layer 115 is not etched at all or not significantly etched by the etching of opaque layer 120.

In FIG. 1F, a patterned photoresist layer 170 is formed. Photoresist layer 170 covers all of binary reticle image 125A and first, second and third attenuated phase shift reticle images 130B, 135B and 140B and none of intermediate structures 145B and 150B. Intermediate structures consist of regions of partial transmittance layer 115 surrounded by exposed substrate 100. The pattern of patterned photoresist layer 170 is defined by a mask fabrication data set as described infra.

In FIG. 1G, trenches 175 have been etched into substrate 100 on either side of partial transmittance layer 115 in regions 145 and 150 (e.g., by reactive ion etching) where substrate 100 was not protected by photoresist layer 170 (see FIG. 1F) or partial transmittance layer 115 to form a completed embedded attenuated phase shift reticle image 145C and an intermediate structure 150C. Photoresist layer 170 (see FIG. 1F) is removed after etching substrate 100. Partial transmittance layer 115 is not etched at all or not significantly etched by the etching of substrate 100. Trenches 175 are etched a distance D1 into substrate 100 from top surface 105 of substrate 100. In one example, D1 is about 1100 Å for a phase shift of 180° at a designed wavelength of 193 nm in a quartz substrate.

In FIG. 1H, a patterned photoresist layer 180 is formed. Photoresist layer 180 covers all of binary reticle image 125A, negative and positive phase shift masks 130B and 135B, attenuated phase shift reticle image 140B embedded attenuated phase shift reticle image 145C and the none of intermediate structure 150C which consist of a regions of partial transmittance layer 115 surrounded by trenches 175. The pattern of patterned photoresist layer 180 is defined by a mask fabrication data set as described infra.

In FIG. 1I, partial transmittance layer 115 has been removed (e.g., by reactive ion etching) where partial transmittance layer 115 was not protected by photoresist layer 180 (see FIG. 1H) to form a completed alternating phase shift reticle image 150D consisting of a region of 185 of substrate 100 surrounded by trench 175. Photoresist layer 180 (see FIG. 1H) is removed after etching partial transmittance layer 115. Substrate 100 is not etched at all or not significantly etched by the etching of partial transmittance layer 115.

FIGS. 2A through 2F are top views of the exemplary reticle image types illustrated in cross-section in FIG. 1I. A polygon is defined as a closed plane figure bounded by three or more line segments. The reticle images of FIGS. 2A through 2F are illustrated as four-sided polygons (i.e., squares) through they may polygons of any number of sides. (Reticle images are three dimensional structures, the polygon shapes describe the top surfaces of the shapes when viewed perpendicular to the top surface of substrate 100.) Further, more complex reticle images may comprise one or more abutting polygons, to form, for example, "L" and "T" shaped figures. Reticle images may include nested polygons where the reticle image consists of the area between an inner and outer polygon (e.g., as in a ring).

In FIG. 2A, binary reticle image 125A comprises a polygon of opaque layer 120 on and coextensive with partial transmittance layer 115. A binary reticle image according to embodiments of the present invention is defined as a mask structure consisting of an opaque layer on a top surface of and coextensive with a partial transmittance layer, a bottom surface of the partial transmittance layer on a top surface of a reticle substrate.

The present invention distinguishes between two types of phase shift reticles based on the structures involved. The first will be called a positive phase shift reticle and the second a negative phase shift reticle.

In FIG. 2B, a positive phase shift reticle image 130B comprises a polygon of opaque layer 120 on a partial transmittance layer 115. A perimeter 121 of opaque layer 120 is completely within a perimeter 116 of partial transmittance layer is 115. A positive phase shift reticle image according to embodiments of the present invention is defined as a physical structure consisting of a solid opaque layer on a top surface of a solid partial transmittance layer, a bottom surface of the partial transmittance layer formed on a top surface of a reticle substrate, a perimeter of the opaque layer completely contained within a perimeter of the partial transmittance layer.

In FIG. 2C, a negative second phase shift reticle image 135B comprises a polygon of opaque layer 120 on a partial transmittance layer 115. A region of partial transmittance layer 115 is exposed in opening 165 in opaque layer 115. A negative phase shift reticle image according to embodiments of the present invention is defined as a physical structure consisting of an opaque layer on a top surface of a solid partial transmittance layer, a bottom surface of the partial transmittance layer formed on a top surface of a reticle substrate, an outer perimeter of the opaque layer coextensive with a perimeter of the partial transmittance layer, a region of the partial transmittance layer exposed in an opening in the opaque layer, the opening completely surrounded by opaque layer.

The present invention distinguishes between two types of attenuated reticles based on the structures involved. The first will be called an attenuated phase shift reticle and the second an embedded attenuated shift reticle.

In FIG. 2D, attenuated reticle image 140B comprises a polygon of partial transmittance layer 115. An attenuated reticle image according to embodiments of the present invention is defined as a physical; structure consisting of a partial transmittance layer with a bottom surface of the partial transmittance layer on a top surface of a reticle substrate.

In FIG. 2E, embedded attenuated phase shift reticle image 145C comprises a polygon of partial transmittance layer 115 completely surrounded by trench 175 formed in reticle substrate 100. An embedded attenuated phase shift reticle image according to embodiments of the present invention is defined as a physical structure consisting of an partial transmittance layer on a top surface of a reticle substrate surrounded by a trench in the reticle substrate, a bottom surface of the partial transmittance layer on a top surface of the reticle substrate, the trench extending from the top surface of the reticle substrate a distance less than the thickness of the reticle substrate into the reticle substrate.

In FIG. 2F, alternating phase shift reticle image 150D comprises a polygon of reticle substrate 100 completely surrounded by trench 175 formed in reticle substrate 100. An alternating phase shift reticle image according to embodiments of the present invention is defined as a physical structure consisting of a region of a reticle substrate completely surrounded by a trench in the reticle substrate, the trench extending from the top surface of the reticle substrate a distance less than the thickness of the reticle substrate into the reticle substrate.

FIG. 2G is a cross-sectional view of a seventh reticle image type according to embodiments of the present invention. In FIG. 2G, binary alternating phase shift reticle image 190 comprises a polygon of partial transmittance layer 115 under and coextensive with opaque layer 120 and completely surrounded by trench 175 formed in reticle substrate 100. An binary alternating phase shift reticle image according to embodiments of the present invention is defined as a physical structure consisting of an opaque layer on a top surface of and coextensive with a partial transmittance layer, surrounded by a trench in a reticle substrate, a bottom surface of the partial transmittance layer on a top surface of the reticle substrate, the trench extending from the top surface of the reticle substrate a distance less than the thickness of the reticle substrate into the reticle substrate.

Fabrication of reticle image 190 is easily integrated into the fabrication scheme of FIGS. 1A through 1I. For example, in FIG. 1F, if photoresist layer protects opaque layer 120 of intermediate reticle image 145A, then in FIG. 1G binary alternating phase shift reticle image 190 would result. Thus it should be understood, that if it is desired to fabricate a reticle having a combination of two or more of reticle images 125A, 130B, 135B, 140B, 145C, 150D and 190 the steps illustrated in FIGS. 1A through 1I may be modified, rearranged or certain steps eliminated as required to form only the combination of reticle image typess desired.

FIG. 3A illustrates an aerial image generated from a binary reticle image. In FIG. 3A, incident light 195 is projected through binary reticle image 125A on reticle substrate 100 which generate an aerial image illustrated by solid line of the plot of light intensity vs. distance. The dashed lines are the projection of the edges of binary reticle image 125A.

FIG. 3B illustrates an aerial image generated from an attenuated phase shift reticle image. In FIG. 3B, incident light 195 is projected through attenuated reticle image 140B on reticle substrate 100 which generate an aerial image illustrated by solid lines of the first plot of light phase vs. distance and a second plot of intensity vs. distance. The dashed lines are the projection of the edges of attenuated phase shift reticle image 140B. A significantly sharper aerial image than that of FIG. 3A is produced.

FIG. 3C illustrates an aerial image generated from an alternating phase shift reticle image. In FIG. 3C, incident light 195 is projected through alternating phase shift reticle image 150D on reticle substrate 100 which generate an aerial image illustrated by solid lines of the first plot of light phase vs. distance and a second plot of intensity vs. distance. The dashed lines are the projection of the edges of trenches 175 of reticle image 150D. A significantly sharper aerial image than that of FIG. 3A is alternating phase shift produced. The aerial image generated comprises very sharp sets of narrow double images.

Figure 4:
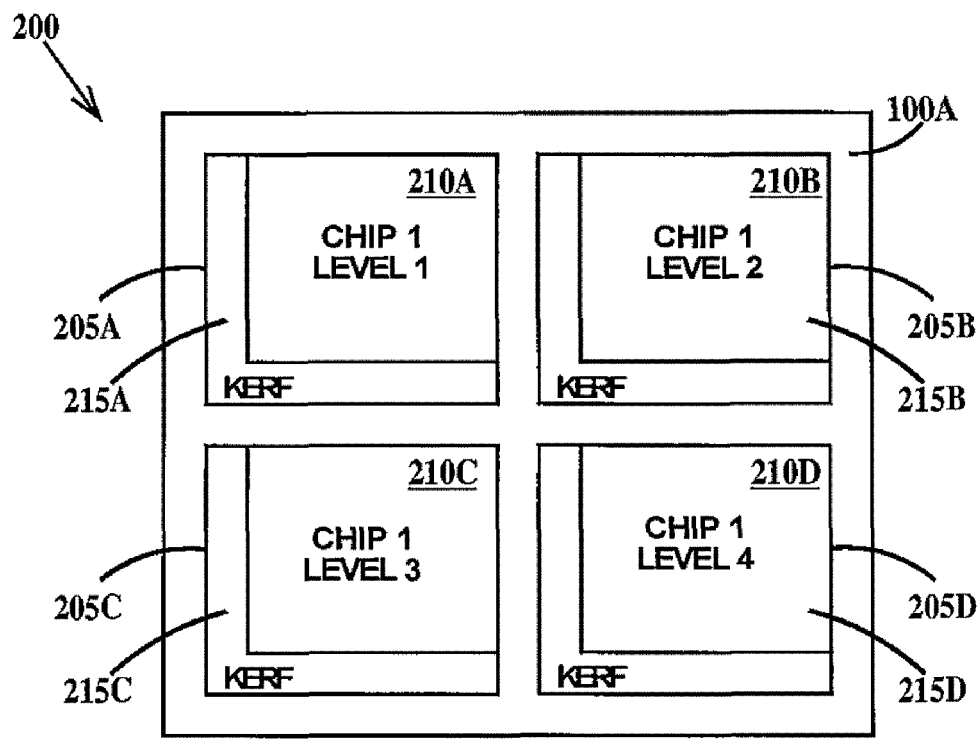
FIG. 4 illustrates a first example of a multi-chip reticle according to the embodiments of the present invention.

FIG. 4 illustrates a first example of a multi-chip reticle according to the embodiments of the present invention. In FIG. 4, a multi-chip reticle 200 includes four chip images 205A, 205B, 205C and 205D arranged in an array on a reticle substrate 100A. Chip image 205A includes an active chip region 210A and a kerf region 215A. Chip image 205B includes an active chip region 210B and a kerf region 215B. Chip image 205C includes an active chip region 210C and a kerf region 215C. Chip image 205D includes an active chip region 210D and a kerf region 215D. While four chip images are illustrated in FIG. 4, there may be a few as two up to as many as can be accommodated on a reticle substrate.

A reticle contains one or more chip images of chips that will be fabricated on a semiconductor substrate called a wafer. Each chip image on a reticle can contain very many reticle images. Chip images from the reticle are transferred to a photoresist layer on the wafer in a photolithographic exposures tool (often referred to as a step and expose tool or just simply a stepper) by stepping the wafer under the reticle and passing light through one or more of the chips on the reticle. Shutters in the step and expose tool control which chip image is used. Kerf regions are regions that are electrically not part of the function of the integrated circuit and may contain test and monitor structures as well as providing "streets" for singulating individual integrated circuit chips of a multi-chip wafer. Multi-chip reticles according to embodiments of the present invention contain at least two chip images, two chip images of the at least two chip images consisting of different type reticle image types.

Figure 9A:
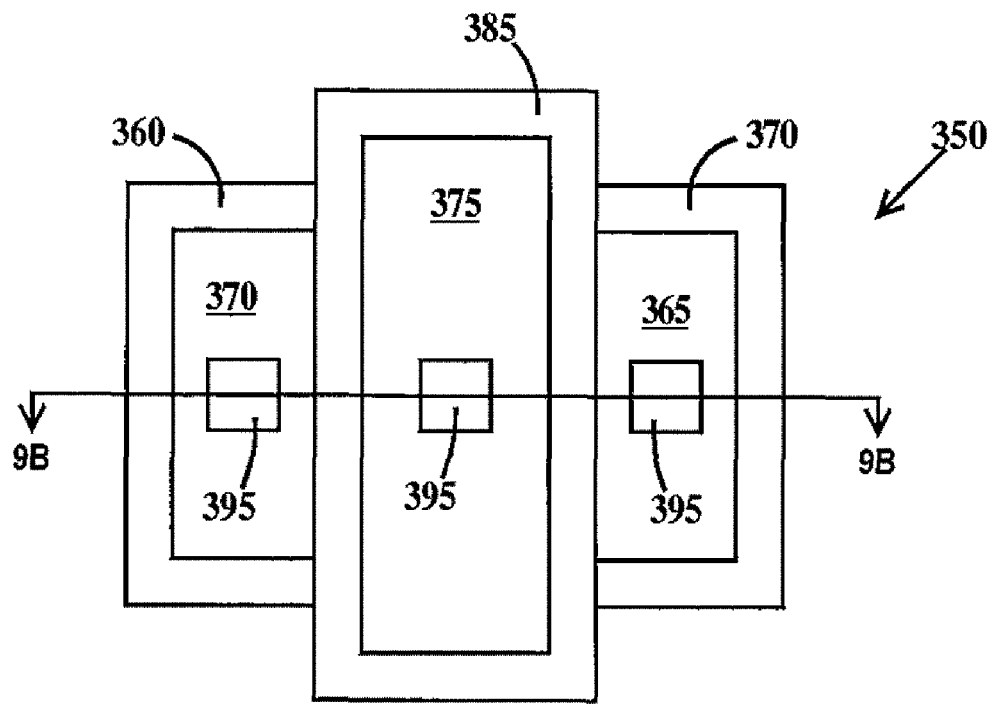
FIG. 9A is a top view and FIG. 9B is a side view through line 9B-9B of FIG. 9A of an exemplary field effect transistor (FET)
Figure 9B:
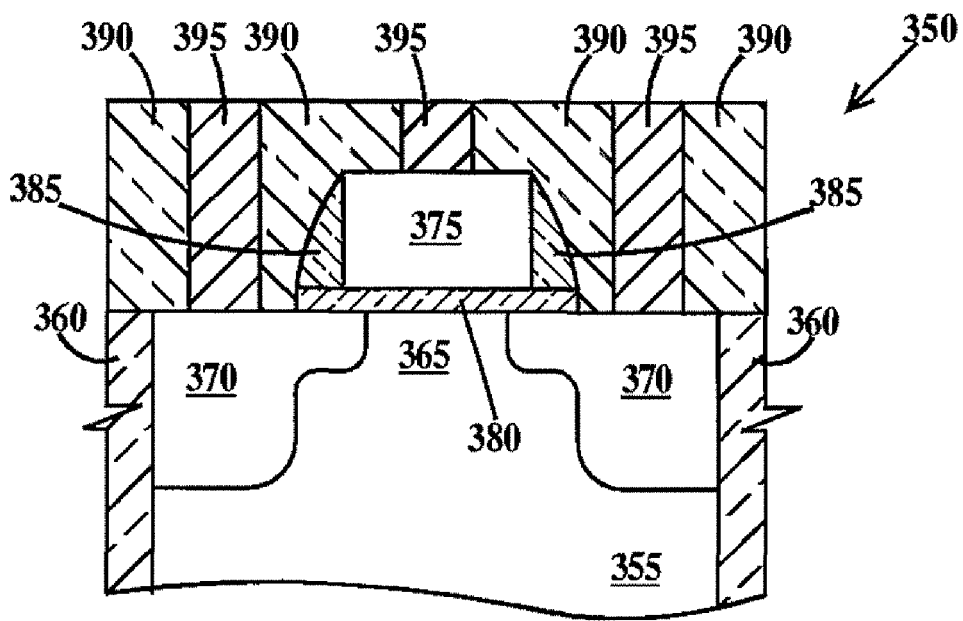

Returning to FIG. 4, chip images 205A, 205B, 205C and 205D define different levels (Level 1 through 4) of a same integrated circuit (chip 1). Each of chip images 205A, 205B, 205C and 205D consist of one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the chips have different types of reticle images. In one example, chip image 205A consists of binary reticle images that define an isolation (RX) level of an integrated circuit, chip image 205B consists of alternating phase shift reticle images that define a gate (PC) level of the same integrated circuit, chip image 205C consists of embedded attenuated phase shift reticle images that define a contact (CA) level of the same integrated circuit, and chip image 205D consists of embedded attenuated phase shift reticle images that define a first wiring (M1) level of the same integrated circuit. FIGS. 9A and 9B, described infra, illustrate a typical field effect transistor structure illustrating isolation, gate and contact levels.

Figure 5:
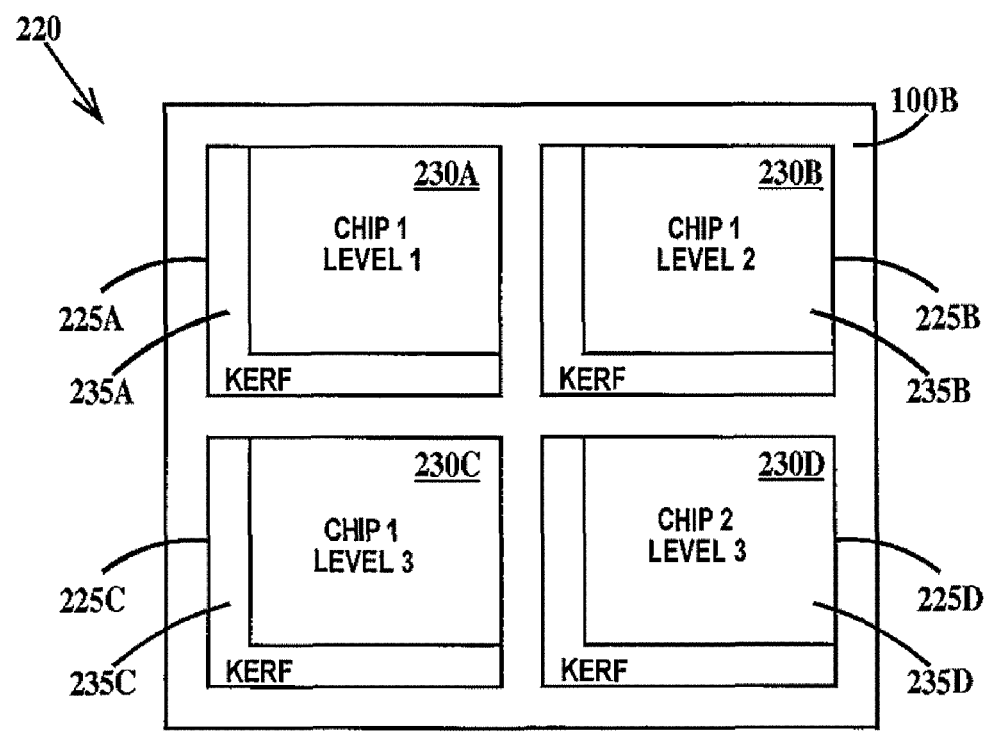
FIG. 5 illustrates a second example of a multi-chip reticle according to the embodiments of the present invention.

FIG. 5 illustrates a second example of a multi-chip reticle according to the embodiments of the present invention. In FIG. 5, a multi-chip reticle 220 includes four chip images 225A, 225B, 225C and 225D arranged in an array on a reticle substrate 100B. Chip image 225A includes an active chip region 230A and a kerf region 235A. Chip image 225B includes an active chip region 230B and a kerf region 235B. Chip image 225C includes an active chip region 230C and a kerf region 235C. Chip image 225D includes an active chip region 230D and a kerf region 235D. While four chip images are illustrated in FIG. 5, there may be a few as two up to as many as can be accommodated on a the reticle substrate. Chip images 225A, 225B and 225C define different levels (Level 1 through 3) of a same integrated circuit (chip 1). Chip image 225D defines a different version (e.g., part number) of level 3 for a different chip (chip image 2). Thus by using chip images 230A, 230B and 230C a first integrated circuit may be fabricated and by using chip images 230A, 230B and 230D a second integrated circuit may be fabricated where chip images 230A and 230B are common to both the first and second integrated circuit. Each of chip images 225A, 225B, 225C and 225D consist of one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the chips have different types of reticle images. In one example, chip image 225A consists of binary reticle images that define a common isolation (RX) level of an two part number integrated circuits, chip image 225B consists of alternating phase shift reticle images that define a common gate (PC) level of the same two part number integrated circuits, chip image 225C consists of embedded attenuated phase shift reticle images that define a first wiring level (M1) of a first part number integrated circuit and chip image 225D consists of embedded attenuated phase shift reticle images that define a first wiring layer (M1) of a second part number integrated circuit.

Figures 6, 7:
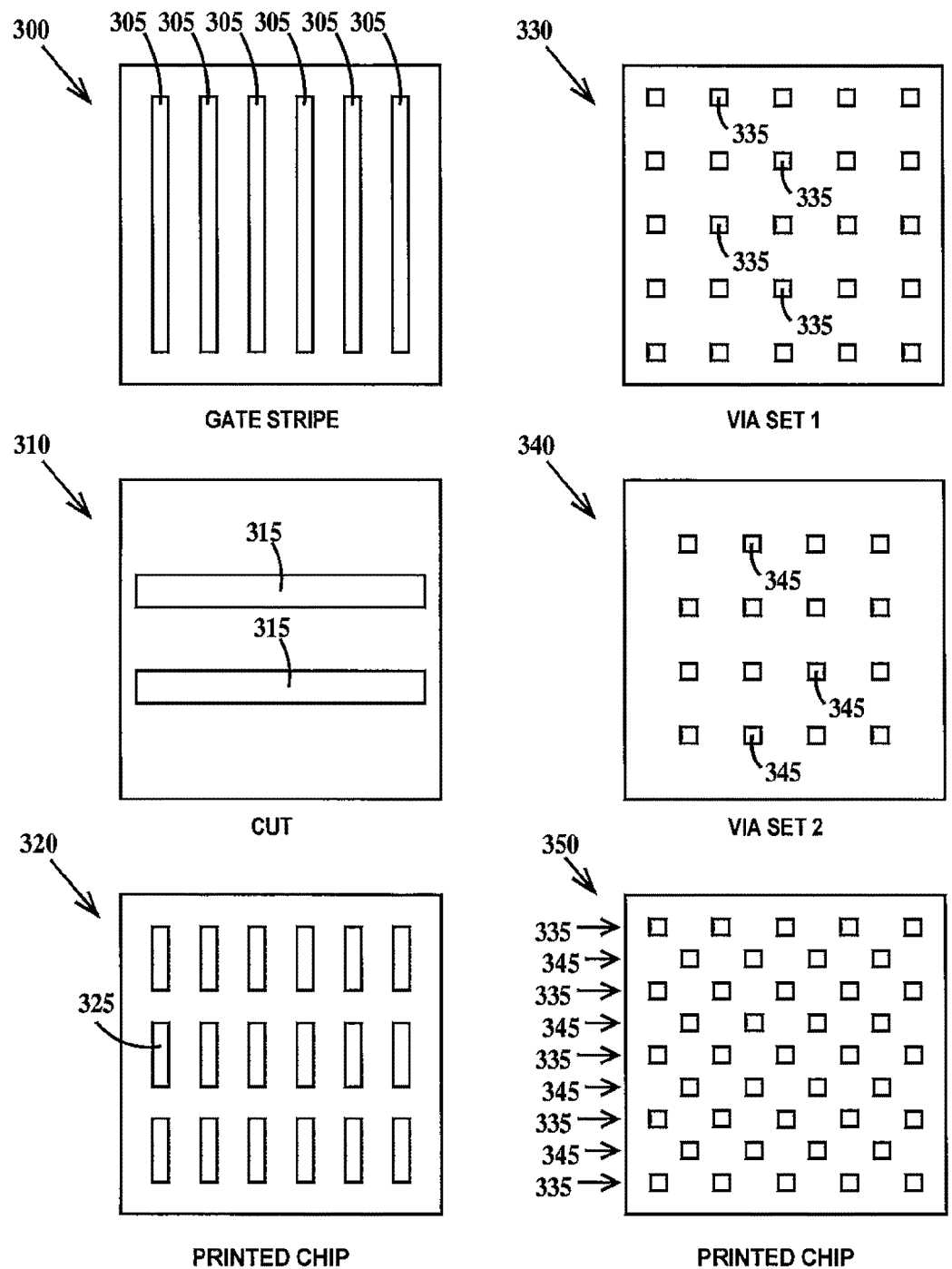
FIG. 6 illustrates an exemplary first pair of reticles for a dual-mask chip fabrication level requiring a "cut" reticle.
FIG. 7 illustrates an exemplary second pair of reticles for a dual-mask chip fabrication level for double exposure of a single photoresist layer.

FIG. 6 illustrates an exemplary first pair of reticles for a dual-reticle chip fabrication level requiring a "cut" reticle. In FIG. 6, a gate reticle 300 includes "gate stripe" reticle images 310 and a "cut" reticle 310 includes reticle images 315. To fabricate a gate level of an integrated circuit, (1) a first photoresist layer is formed on a layer of gate material, (2) reticle 300 is used to define gate stripe patterns in the first photoresist layer, (3) the gate stripes formed by etching the gate material into stripes and the first photoresist layer removed, (4) a second layer of photoresist is formed over the gate stripes, (5) reticle 310 is used to cut the gate stripes into individual gates by etching, and (6) the second photoresist layer is removed. FIG. 6 further illustrates an integrated circuit chip 320 having gates 325 formed using reticles 300 and 310 using the process just described.

FIG. 7 illustrates an exemplary second pair of reticles for a dual-reticle chip fabrication level for double exposure of a single photoresist layer. In FIG. 7, a first via reticle 330 includes via reticle images 335 and a second via reticle 340 includes via reticle images 345. To fabricate a via level of an integrated circuit, (1) a photoresist layer is formed on an insulating layer, (2) a first exposure of the photoresist layer using reticle 330 is performed, (3) a second exposure of the photoresist layer using reticle 340 is performed, (4) the photoresist layer is developed, (5) vias are formed by etching through the insulating layer, and (6) the photoresist layer is removed. FIG. 7 further illustrates an integrated circuit chip 350 having vias 335 and 340 formed using reticles 330 and 340 using the process just described. In completed integrated circuits, a via is filled with metal and electrically connects two wiring levels that the via is disposed between.

Figure 8:
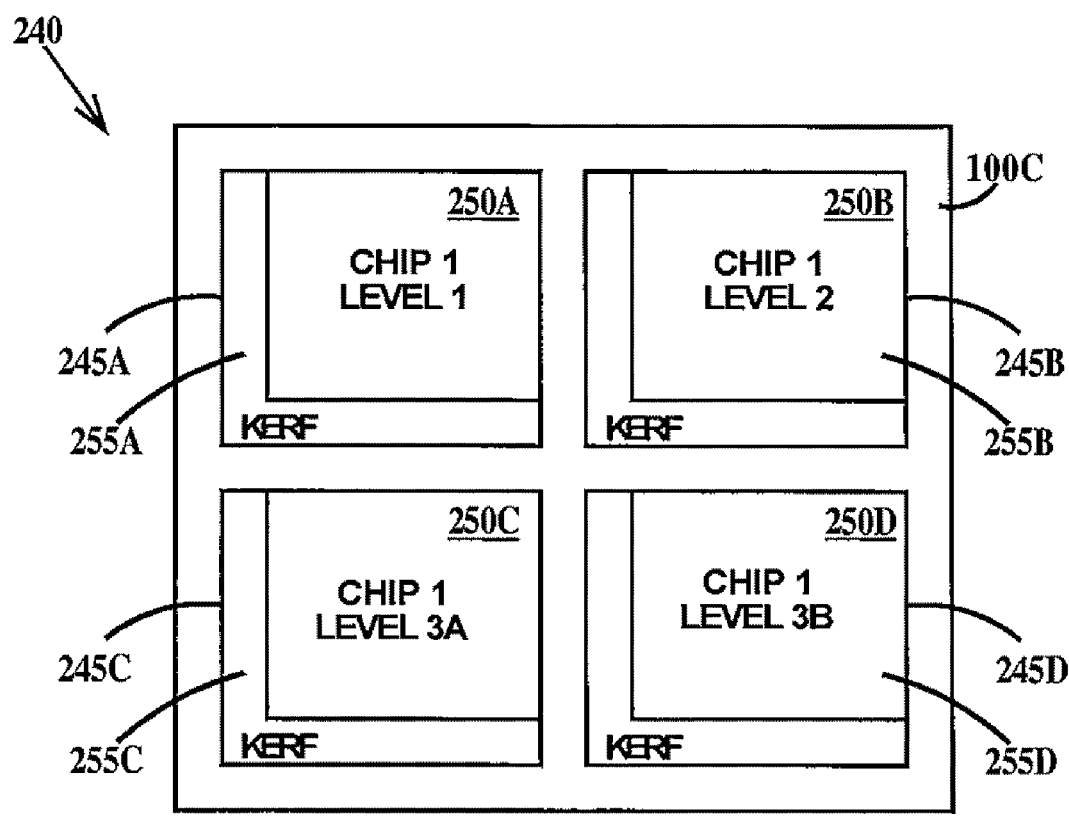
FIG. 8 illustrates a third example of a multi-chip reticle according to the embodiments of the present invention.

FIG. 8 illustrates a third example of a multi-chip reticle according to the embodiments of the present invention. In FIG. 8, a multi-chip reticle 240 includes four chip images 245A, 245B, 245C and 245D arranged in an array on a reticle substrate 100C. Chip image 245A includes an active chip region 250A and a kerf region 255A. Chip image 245B includes an active chip region 250B and a kerf region 255B. Chip image 245C includes an active chip region 250C and a kerf region 255C. Chip image 245D includes an active chip region 240D and a kerf region 245D. While four chip images are illustrated in FIG. 8, there may be a few as two chip images up to as many chip images as can be accommodated on a the reticle substrate. Chip images 245A and 245B define different levels (Level 1 and 2) of a same integrated circuit (chip 1). Chip images 245C and 245D define a third (level 3) for the same integrated circuit. Chip images 245C and 245D are used in a dual-reticle process, examples of which are illustrated in FIGS. 6 and 7 and described supra. Each of chip images 245A, 245B, 245C and 245D consist of one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the chips have different types of reticle images. In one example, chip image 245A consists of binary reticle images that define a isolation (RX) level of an integrated circuit, chip image 245B consists of embedded attenuating phase shift reticle images that define a first wiring level (M1) level of the same integrated circuit, chip image 245C consists of embedded attenuated phase shift reticle images that define a gate stripe (PC) of the same integrated circuit and chip image 245D consists of embedded attenuated phase shift reticle images that define a cut layer (CT) of a the same integrated circuit. Alternatively, chip image 245C consists of embedded attenuated phase shift reticle images that define a first via set (CA1) of the same integrated circuit and chip image 245D consists of embedded attenuated phase shift reticle images that define a second via set (CA2) of the same integrated circuit.

FIG. 9A is a top view and FIG. 9B is a side view through line 9B-9B of FIG. 9A of an exemplary FET. In FIGS. 9A and 9B, an FET 350 comprises a semiconductor substrate 355 in which trench dielectric isolation 360 is formed. A channel 365 is formed between source/drains 370 in substrate 355. A gate 375 is formed over channel 365 and separated from the channel by a gate dielectric layer 380. Dielectric sidewall spacers 385 are formed on the sidewalls of gate 375. A dielectric layer 390 is formed over dielectric isolation 360, exposed regions of source/drains 370, gate 375 and spacers 385. Contacts 395 are formed through dielectric layer 390 to source drains 370 and gate 375. A wiring level (not shown) may be formed to electrically connect contacts 395 into an integrated circuit. Contacts 395 are filled with an electrical conductor after fabrication is complete and disposed between and electrically connects a wiring level to silicon structure in a semiconductor substrate (e.g., source/drain, or a polysilicon structure (e.g., gate electrode).

FIG. 10 is a flowchart illustrating a fabrication of integrated circuit using multi-chip reticles according to embodiments of the present invention. In step 400, a multi-chip reticle having two or more chip images each chip image having only of one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the two or more chips have different types of reticle images is loaded into a step and expose tool. In step 405, a wafer with a first photoresist layer thereon is loaded into the step and expose tool. In step 410, the first photoresist layer is exposed with a first chip image of the two or more chip images of the multi-chip reticle. In step 415, the first photoresist layer is developed. In step 420, additional processing (e.g., etching, ion implantation, etc.) of the wafer is performed and the first photoresist layer removed. In step 425, the same wafer with a second/next photoresist layer thereon is loaded into the step and expose tool. In step 425, the second/next photoresist layer is exposed with a second/next chip image of the two or more chips of the multi-chip reticle. In step 430, the second/next photoresist layer is developed. In step 435, additional processing (e.g., etching, ion implantation, etc.) of the wafer is performed and the second/next photoresist layer removed. In step 440, it is decided if another process sequence is required. If so, the method loops back to step 425, if not the method terminates.

FIG. 11 is a flowchart illustrating a fabrication of integrated circuit using multi-chip reticles in a dual-reticle chip fabrication process according to embodiments of the present invention. In step 445, a multi-chip reticle having two or more chip images each chip image having only one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the two or more chip images have different types of reticle images is loaded into a step and expose tool. In step 450, a wafer with a photoresist layer thereon is loaded into the step and expose tool. In step 455, the photoresist layer is exposed with a first chip image of the two or more chip images of the multi-chip reticle. In step 460, the photoresist layer is exposed with a second/next chip of the two or more chip images of the multi-chip reticle and the photoresist layer is developed. In step 435, additional processing (e.g., etching, ion implantation, etc.) of the wafer is performed and the layer removed.

It should be understood that a single multi-chip reticle according to the embodiments of the present invention could be used in both the process flow of FIG. 10 and the process flow of FIG. 11 (see multi-chip reticle 240 of FIG. 8). In effect, the process flow of FIGS. 10 and 11 can be merged.

FIG. 12 is a flowchart illustrating fabrication of a multi-chip reticle according to the embodiments of the present invention. In step 470, one or more integrated circuit chip designs are obtained or generated. In step 475, the fabrication levels of the integrated circuit chip design(s) for inclusion on a multi-chip reticle are selected. In step 480, mask shape datasets are generated for the selected fabrication levels. The different mask shapes of the mask datasets are all placed on a same chip grid so the shapes of the different levels will align properly. Mask shapes are different from reticle shapes. Mask shapes are two dimensional data constructs that exist only as data on a data storage media, memory of a computer system, a display on a computer screen or a drawing. Two mask shape datasets will be generated for those fabrication levels requiring double photoresist exposure or a "cut" reticle. In step 485, each selected mask shape dataset is assigned a reticle image type. The selected mask shape datasets are merged into a single multi-chip reticle mask dataset. This comprises offsetting the chip grid values to multi-chip reticle grid values and placing the mask shapes on the multi-chip reticle grid, so the physical multi-chip reticle's chip images do not overlay each other and are placed in a two-dimensional array as, for example, in FIGS. 4, 5 and 8. Information as to the reticle image type of each of the merged mask shape datasets is retained in the single multi-chip reticle dataset. In step 490, a set of mask writer data datasets is generated based on the multi-chip reticle dataset and the reticle image types of the selected mask shape datasets. In step 495, the mask shape datasets are used to fabricate the multi-chip reticle using a mask writer. This process can involve multiple write/develop/etch processes.

In one example, the datasets are used by an electron-beam direct write mask writer to define a pattern in an electron sensitive photoresist. The multi-chip reticle has two or more chip images each chip image having only one type of reticle image selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images with the proviso that at least two of the two or more chips have different types of reticle images.

Figure 13:
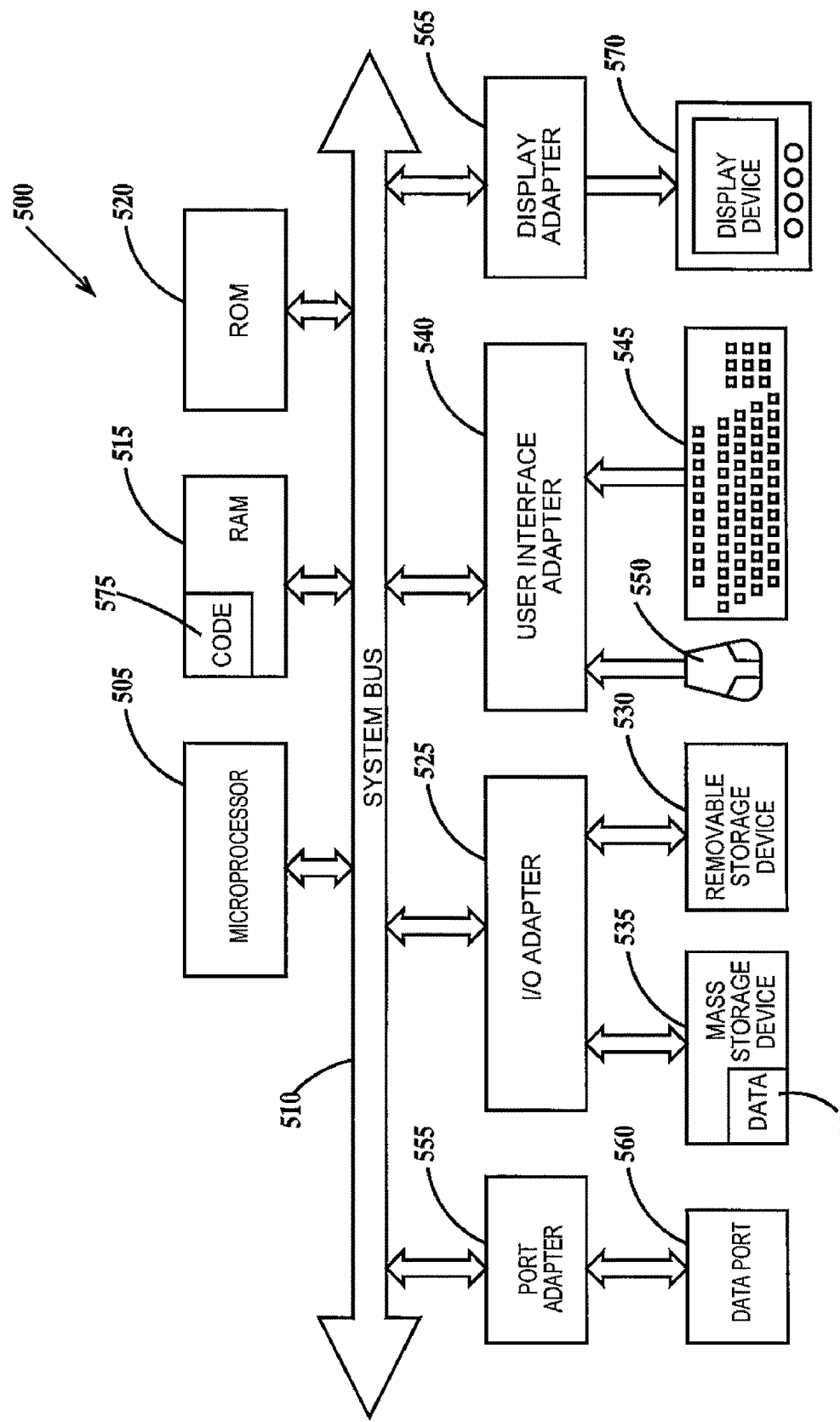
FIG. 13 is a schematic block diagram of a general-purpose computer.

Generally, the method described herein with respect to designing a multi-chip reticles as illustrated in FIG. 12 is practiced with a general-purpose computer and the methods described supra in the flow diagrams of FIG. 13 may be coded as a set of instructions on removable or hard media for use by the general-purpose computer.

FIG. 13 is a schematic block diagram of a general-purpose computer. In FIG. 13, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

Thus, the embodiments of the present invention provide multi-chip reticles, methods of fabricating integrated circuit chips using multi-chip reticles, methods of fabricating multi-chip reticles, methods of designing multi-chip reticles and a system for designing multi-chip reticles that can reduce the costs of mask fabrication.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming an integrated circuit chip, comprising:
   (a) loading a multi-chip reticle into a photolithographic exposure tool, said multi-chip reticle having two or more separate chip images arranged in an array, each chip image of said two or more chip images having only one type of reticle image, wherein at least two of said two more chip images have different types of reticle images;
   after (a), (b) coating a semiconductor substrate with a photoresist layer, loading said substrate into said photolithographic exposure tool, exposing said first photoresist layer using a first chip image of said two or more chip images; and
   after (b), (c) removing said substrate from said photolithography tool, developing said first photoresist layer, processing said substrate, removing said first photoresist layer, coating said semiconductor substrate with a second photoresist layer, loading said substrate into said photolithographic exposure tool, exposing said second photoresist layer using a second chip image of said two or more chip images, said second chip image having only one and a different type of reticle image than said first chip image, removing said substrate, developing said second photoresist layer, further processing said substrate and removing said second photoresist layer.

2. The method of claim 1, wherein said types of reticle images are selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images.

3. The method of claim 1, wherein said processing and said further processing are independently selected from the group consisting of ion implantation, etching and deposition.

4. The method of claim 1, wherein each chip image of said two or more chip images define different fabrication levels of a same integrated circuit chip design.

5. The method of claim 1, wherein at least two chip images of said two or more chip images define a same fabrication level of integrated circuit chips of different design.

6. The method of claim 1, wherein at least two chip images of said two or more chip images in combination define a same fabrication level of a same integrated circuit chip design.

7. The method of claim 1, wherein said chip images define fabrication levels of a field effect transistor, said fabrication levels selected from the group consisting of trench dielectric isolation fabrication levels, gate fabrication levels, contact fabrication dielectric layers, metal wiring fabrication levels and via fabrication levels.

8. A method, comprising:
selecting fabrication levels from one or more integrated circuit designs;
generating a mask shape dataset for each selected fabrication level;
merging said mask shape datasets into a single multi-chip mask shape dataset representing two or more chip images, each chip image of said two or more chip images assigned only one type of reticle image, wherein at least two of said two more chip images are assigned different types of reticle images;
generating a set of mask writer datasets based on said multi-chip mask shape dataset and reticle image type of each chip image of said two or more chip images; and
wherein said generating said mask shape dataset, merging said mask shape datasets and generating said set of mask writer datasets are performed by processors of one or more computers.

9. The method of claim 8, further including:
fabricating a multi-chip reticle using said mask writer datasets, said multi-chip reticle comprising a transparent substrate having two or more separate chip images arranged in an array, each chip image of said two or more chip images having only one type of reticle image, wherein at least two of said two more chip images consist of different types of reticle images.

10. The method of claim 8, wherein said types of reticle images are selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images.

11. The method of claim 8, wherein each chip image of said two or more chip images define different fabrication levels of a same integrated circuit chip design.

12. The method of claim 8, wherein at least two chip images of said two or more chip images define a same fabrication level of integrated circuit chips of different design.

13. The method of claim 8, wherein at least two chip images of said two or more chip images in combination define a same fabrication level of a same integrated circuit chip design.

14. The method of claim 8, wherein said chip images define fabrication levels of a field effect transistor, said fabrication levels selected from the group consisting of trench dielectric isolation fabrication levels, gate fabrication levels, contact fabrication dielectric layers, metal wiring fabrication levels and via fabrication levels.

15. A computer system including a computer comprising a processor, an address/data bus coupled to said processor, and a computer-readable memory unit coupled to communicate with said processor, said memory unit containing instructions that when executed by the processor implement a method for designing a multi-chip reticle, said method comprising the computer implemented steps of:
selecting fabrication levels from one or more integrated circuit designs;
generating a mask shape dataset for each selected fabrication level;
merging said mask shape datasets into a single multi-chip mask shape dataset representing two or more chip images, each chip image of said two or more chip images assigned only one type of reticle image, wherein at least two of said two more chip images are assigned different types of reticle images; and
generating a set of mask writer datasets based on said multi-chip mask shape dataset and the reticle image type of each chip image of two or more chip images.

16. The computer system of claim 15, wherein said reticle images are selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images.

17. The computer system of claim 15, wherein each chip image of said two or more chip images define different fabrication levels of a same integrated circuit chip design.

18. The computer system of claim 15, wherein at least two chip images of said two or more chip images define a same fabrication level of integrated circuit chips of different design.

19. The computer system of claim 15, wherein at least two chip images of said two or more chip images in combination define a same fabrication level of a same integrated circuit chip design.

20. The computer system of claim 15, wherein said chip images define fabrication levels of a field effect transistor, said fabrication levels selected from the group consisting of trench dielectric isolation fabrication levels, gate fabrication levels, contact fabrication dielectric layers, metal wiring fabrication levels and via fabrication levels.

21. A method of forming an integrated circuit chip, comprising:
(a) loading a multi-chip reticle into a photolithographic exposure tool, said multi-chip reticle having two or more separate chip images arranged in an array, each chip image of said two or more chip images having only one type of reticle image, wherein at least two of said two more chip images have different types of reticle images;
after (a), (b) coating a semiconductor substrate with a photoresist layer, loading said substrate into said photolithographic exposure tool, exposing said first photoresist layer using a first chip image of said two or more chip images; and
after (b), (c) exposing said first photoresist layer using a second chip image of said two or more chip images, said second chip image having only one and a different type of reticle image than said first chip image, removing said substrate, developing said first photoresist layer, processing said substrate and removing said first photoresist layer.

22. The method of claim 21, wherein said types of reticle images are selected from the group consisting of binary reticle images, positive phase shift reticle images, negative phase shift reticle images, attenuated phase shift reticle images, embedded attenuated phase shift reticle images, alternating phase shift reticle images and binary alternating phase shift reticle images.

23. The method of claim 21, wherein said processing and said further processing are independently selected from the group consisting of ion implantation, etching and deposition.

24. The method of claim 21, wherein each chip image of said two or more chip images define different fabrication levels of a same integrated circuit chip design.

25. The method of claim 21, wherein at least two chip images of said two or more chip images define a same fabrication level of integrated circuit chips of different design.

26. The method of claim 21, wherein at least two chip images of said two or more chip images in combination define a same fabrication level of a same integrated circuit chip design.

27. The method of claim 21, wherein said chip images define fabrication levels of a field effect transistor, said fabrication levels selected from the group consisting of trench dielectric isolation fabrication levels, gate fabrication levels, contact fabrication dielectric layers, metal wiring fabrication levels and via fabrication levels.

* * * * *